US012731767B2

(12) United States Patent
Jin et al.

(10) Patent No.: US 12,731,767 B2
(45) Date of Patent: Sep. 8, 2026

(54) CHUCKING STATUS DETECTION WITH CHUCKING SENSOR NORMALIZED FIGURE OF MERIT AND ACTIVE CHUCKING VOLTAGE CONTROL

(71) Applicant: Applied Materials, Inc., Santa Clara, CA (US)

(72) Inventors: Yu Jin, Santa Clara, CA (US); Edward P. Hammond, IV, Hillsborough, CA (US); Thomas Rubio, Santa Clara, CA (US); Martin Jay Seamons, San Jose, CA (US); Ganesh Balasubramanian, Fremont, CA (US); Alexander Garachtchenko, Santa Clara, CA (US); Abhijit Kangude, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 19/182,349

(22) Filed: Apr. 17, 2025

(65) Prior Publication Data

US 2026/0081119 A1 Mar. 19, 2026

Related U.S. Application Data

(60) Provisional application No. 63/694,281, filed on Sep. 13, 2024.

(51) Int. Cl.
*H01J 37/32* (2006.01)
*H10P 72/72* (2026.01)

(52) U.S. Cl.
CPC ........ *H01J 37/32715* (2013.01); *H10P 72/72* (2026.01); *H01J 2237/2007* (2013.01); *H01J 2237/24564* (2013.01); *H01J 2237/3323* (2013.01)

(58) Field of Classification Search
CPC ..... H01J 2237/24564; H01J 2237/3323; H01J 37/32715; H01L 21/6831
See application file for complete search history.

(56) References Cited

U.S. PATENT DOCUMENTS

| | | | |
|---|---|---|---|
| 5,646,814 | A | 7/1997 | Shamouilian et al. |
| 5,872,594 | A | 2/1999 | Thompson |
| 9,428,833 | B1 | 8/2016 | Duvall et al. |
| 10,460,916 | B2 | 10/2019 | Boyd, Jr. et al. |
| 2001/0055189 | A1 | 12/2001 | Hagi |
| 2002/0086546 | A1 | 7/2002 | Yamashita et al. |

(Continued)

OTHER PUBLICATIONS

International Search Report and Written Opinion for PCT/US2025/044980 Dated Jan. 9, 2026.

*Primary Examiner* — Christopher J. Besler
(74) *Attorney, Agent, or Firm* — Patterson + Sheridan, LLP

(57) ABSTRACT

A method for monitoring a chucking status of a substrate, including: supplying chucking voltage to an electrostatic chuck disposed in a substrate pedestal, wherein a substrate is supported by the substrate pedestal, sending a signal to an electrode of an electrostatic chuck at a frequency range, measuring an impedance of the signal, comparing the measured impedance to a baseline impedance value to obtain a chucking status value, and determining a chucking status of the substrate based on the chucking status value, wherein the chucking status comprises not-chucked, under-chucked, fully-chucked, or over-chucked.

13 Claims, 7 Drawing Sheets

(56) References Cited

U.S. PATENT DOCUMENTS

| | | | |
|---|---|---|---|
| 2008/0084650 | A1 | 4/2008 | Balasubramanian et al. |
| 2011/0090613 | A1 | 4/2011 | Balasubramanian et al. |
| 2013/0003250 | A1 | 1/2013 | Morimoto et al. |
| 2013/0100573 | A1 | 4/2013 | Shu |
| 2014/0268479 | A1 | 9/2014 | West et al. |
| 2017/0345698 | A1 | 11/2017 | Hammond, IV et al. |
| 2020/0245880 | A1 | 8/2020 | Choi et al. |
| 2023/0298920 | A1* | 9/2023 | Golovkov ......... H01L 21/67288 |

* cited by examiner

CHUCKING STATUS DETECTION WITH CHUCKING SENSOR NORMALIZED FIGURE OF MERIT AND ACTIVE CHUCKING VOLTAGE CONTROL

CROSS-REFERENCE TO RELATED APPLICATION

This application claims priority to and the benefit of U.S. Provisional Ser. No. 63/694,281, filed Sep. 13, 2024, which is incorporated by reference herein in its entirety.

BACKGROUND

Field

Embodiments of the present disclosure generally relate to a process chamber for processing a substrate.

Description of the Related Art

In the processing of substrates, such as semiconducting substrates, the substrate is placed on a support in a processing chamber, and suitable processing conditions are maintained in the processing chamber.

Electrostatic chucks (ESCs) securely hold substrates in place during the various stages of manufacturing processes. Unlike mechanical clamps, ESCs utilize electrostatic attraction to secure the substrate without a mechanical clamp, thus reducing risk of damage to surfaces of the semiconductor substrate. The ESCs generate an electrostatic field between the chuck and the substrate thus securing the substrate in place with a flat substrate profile.

During processing, over-chucking can induce damage in the substrate and under-chucking can cause arcing during processes leading to substrate damage. Further, incomplete de-chucking can cause breakage.

Thus, there is a need for improved methods for detecting chucking status.

SUMMARY

In one or more embodiments, a method for monitoring a chucking status of a substrate, including: supplying chucking voltage to an electrostatic chuck disposed in a substrate pedestal, wherein a substrate is supported by the substrate pedestal, sending a signal to an electrode of an electrostatic chuck at a frequency range, measuring an impedance of the signal, comparing the measured impedance to a baseline impedance value to obtain a chucking status value, and determining a chucking status of the substrate based on the chucking status value, wherein the chucking status comprises not-chucked, under-chucked, fully-chucked, or over-chucked.

In one or more embodiments, a method for monitoring a chucking status of a substrate, including: supplying chucking voltage to an electrostatic chuck disposed in a substrate pedestal, wherein a substrate is supported by the substrate pedestal, sending a signal to an electrode of an electrostatic chuck at a frequency range, measuring an impedance of the signal, normalizing the impedance over the frequency range, comparing the normalized impedance to a baseline impedance value to obtain a chucking status value, and determining a chucking status of the substrate based on the chucking status value.

In one or more embodiments, a method for actively controlling chucking voltage to chuck a substrate, including: supplying chucking voltage to an electrostatic chuck disposed in a substrate pedestal, wherein a substrate is supported by the substrate pedestal, sending a signal to an electrode of an electrostatic chuck at a frequency range, measuring an impedance of the signal, comparing the measured impedance to a baseline impedance value to obtain a chucking status value indicative of a chucking status of the substrate, and modifying the chucking voltage based on the chucking status value.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to manufacture of semiconductor components and devices. More specifically, embodiments described herein provide chucking status detection and active chucking voltage control.

Figure 1:
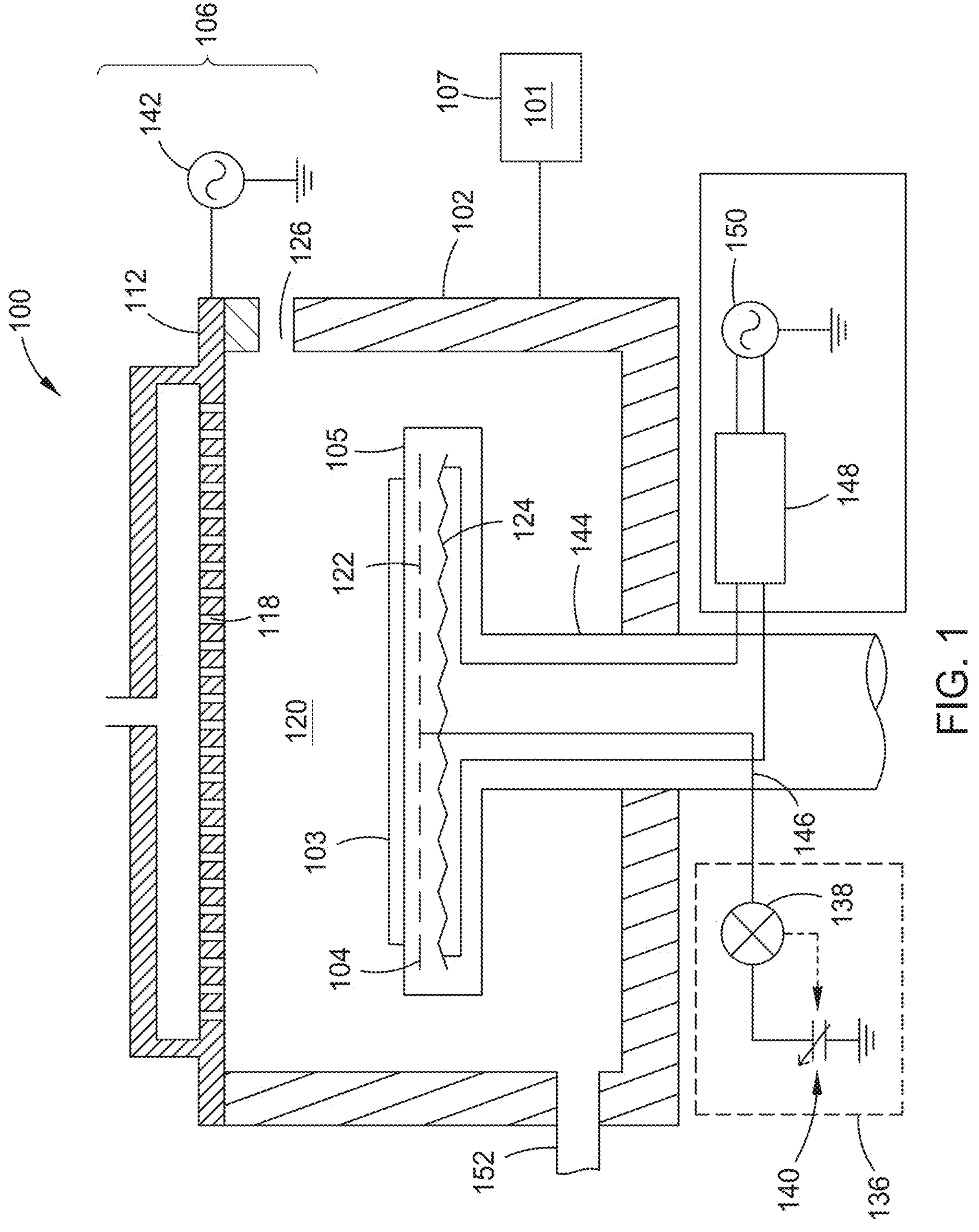
FIG. 1 illustrates a schematic cross-sectional view of an exemplary processing chamber, according to one or more embodiments.

FIG. 1 illustrates a cross-sectional view of an exemplary processing chamber 100. The processing chamber 100 includes a chamber body 102, a substrate support 104 (e.g., pedestal 104) disposed inside the chamber body 102, and a lid assembly 106 coupled to the chamber body 102 and enclosing the pedestal 104 in a processing volume 120.

In operation, a substrate 103 may be provided into the processing volume 120 through an opening 126, which may be conventionally sealed for processing using a slit valve or door. The substrate 103 may be seated on a surface 105 of the pedestal 104 during processing. In one or more embodiments, the pedestal 104 may be rotatable about a vertical axis by a shaft 144 of the pedestal 104. In one or more embodiments, the pedestal 104 is stationary. In some embodiments, the pedestal 104 may be lifted up to rotate as necessary during processing.

A gas distributor 112 distributes process gases into the processing volume 120 through apertures 118. The gas distributor 112 may be coupled to a first source of electric power 142, such as an RF generator, RF power source, DC power source, pulsed DC power source, pulsed RF power source, or any other power source provided that the distributor is electrically isolated from the grounded chamber body 102. In one or more embodiments, the first source 142 is an RF power source.

A first electrode 122 may be coupled to the pedestal 104. In some embodiments, the first electrode 122 may be embedded within the pedestal 104. In some embodiments, the first electrode 122 may be coupled with a surface of the pedestal 104. The first electrode 122 may be a plate, perforated plate, a mesh, a wire screen, or any other distributed arrangement of conductive elements. In some embodiments, the first electrode 122 may be a tuning electrode coupled to a tuning circuit 136 by conduit 146, for example, a cable, having a selected resistance, such as 40 ohms, for example, disposed in the shaft 144 of the pedestal 104. The tuning circuit 136 may have an electronic sensor 138 and an electronic controller 140, which may be a variable capacitor.

The electronic sensor 138 may be a voltage or current sensor and may be coupled to the electronic controller 140 to provide further control over plasma conditions in the processing volume 120.

A second electrode 124, such as a bias electrode and/or an electrostatic chucking electrode, may be coupled with, disposed in, or disposed on pedestal 104. The second electrode 124 may be coupled with a second source of electric power 150 through a filter 148, which may be an impedance matching circuit. The second source of electrical power 150 may include, but is not limited to, DC power, pulsed power, RF bias power, a pulsed RF source or bias power, or a combination thereof. In one or more embodiments, the second source of electrical power 150 may be RF bias power. In some embodiments, pedestal 104 may further include one or more heating elements configured to heat the substrate to a processing temperature, such as between about 25 degrees Celsius and about 800 degrees Celsius or greater.

The lid assembly 106 and pedestal 104 may be used with any processing chamber, such as for plasma or thermal processing. In operation, the substrate 103 may be disposed on the pedestal 104, and process gases may be flowed through the lid assembly 106 via the gas distributor 112 according to a desired flow plan. Electric power may be used with the gas distributor 112 to establish a plasma in the processing volume. Further, the substrate 103 may be subjected to an electric bias using the second electrode 124.

Upon energizing a plasma in the processing volume 120, a potential difference may be established between the plasma and the first electrode 122. The electronic controller 140 may then be used to adjust the flow properties of the ground paths represented by the tuning circuit 136. A set point may be delivered to the tuning circuit 136 to provide independent control of deposition rate and of plasma uniformity from center to edge. In some embodiments, wherein the electronic controllers are both variable capacitors, the electronic sensors may adjust the variable capacitors to maximize deposition rate and minimize thickness non-uniformity independently.

Tuning circuit 136 may have a variable impedance that may be adjusted using the electronic controller 140. In some embodiments, wherein the electronic controller 140 is a variable capacitor, the capacitance range of each of the variable capacitors may be chosen to provide an impedance range. Such an impedance range may depend on the frequency and voltage characteristics of the plasma, which may have a minimum in the capacitance range of each variable capacitor. Accordingly, when the capacitance of the electronic controller 140 is at a minimum or maximum, impedance of the running circuit 136 may be high, resulting in a plasma shape that has a minimum aerial or lateral coverage over the pedestal 104. When the capacitance of the electronic controller 140 approaches a value that minimizes the impedance of the tuning circuit 136, the aerial coverage of the plasma may grow to a maximum effectively covering the entire working area of the pedestal 104. As capacitance of the electronic controller 140 deviates from the minimum impedance setting, the plasma shape may shrink from the chamber walls and aerial coverage of the pedestal 104 may decline.

In one or more embodiments, the plasma conditions and/or gas conditions in the processing volume 120 may be controlled in real time, such as by a controller 101 contained within a processor 107. Gases may exit the processing chamber 100 through an outlet 152.

The electronic sensor 138 may be used to tune the tuning circuit 136 in a closed loop. A set point for current or voltage, depending on the type of sensor used, may be installed in each sensor, and the sensor may be provided with a control software that determines an adjustment to the electronic controller 140 to minimize deviation from the set point. Consequently, a plasma shape may be selected and dynamically controlled during processing. It is to be understood that, while the foregoing discussion is based on electronic controller 140, any electronic component with adjustable characteristics may be used to provide tuning circuit 136 with adjustable impedance.

Processing chamber 100 may be utilized in some embodiments of the present technology for processing methods that may include, but are not limited to, bottom-up deposition of materials for semiconductor substrates. However, a person of ordinary skill would understand that the chamber described herein is not intended to be limiting, and any chamber may be configured to perform operations as described.

The processing of semiconductor substrates, such as the processes described herein, rely on the substrate 103 being completely chucked to the pedestal 104 during processing. The substrate 103 is said to be fully-chucked when the substrate 103 is prevented from extending towards the processing volume 120 and when the substrate 103 is held flat against the pedestal 104. In various embodiments, holding the substrate 103 flat against the pedestal 104 may reduce or eliminate bowing or warpage of the substrate 103.

If the substrate 103 is not fully-chucked, the profile of the substrate 103 may vary with the radius of the substrate 103, leading to inconsistent processing of the substrate 103. Furthermore, if the substrate 103 is not fully-chucked, an air gap may exist between the substrate 103 and the pedestal 104, affecting the backside of the substrate 103. If a substrate 103 is under-chucked, the substrate 103 may move on the pedestal 104 during processing, which may lead to inconsistent processing of the substrate 103. Alternatively, if the substrate 103 is over-chucked, the force applied to the substrate 103 may be too great, resulting in damage (e.g., cracking or shattering) to the substrate 103. A substrate 103 may be over-chucked if the applied chucking voltage is too great.

Accordingly, it is beneficial to apply an optimal chucking voltage to fully-chuck the substrate 103 to the pedestal 104. Furthermore, it is beneficial to detect, monitor, and control, the chucking status of the substrate 103 in situ.

Apparatus and methods described herein allow for detecting, monitoring, and controlling the chucking state of the substrate 103 in situ during a semiconductor process. A signal at a certain frequency or frequency range may be provided to the ESC during the process. If the substrate 103 is not fully-chucked, an air gap may exist between the substrate 103 and the pedestal 104. The air gap may affect the impedance between the substrate 103 and the ESC. This change in impedance may be monitored in real time, and an impedance shift can be observed as the chucking voltage is adjusted. When the impedance reaches a predetermined value, the applied chucking voltage may be considered an optimal voltage for chucking the substrate 103 to the pedestal 104, preventing the system from applying more voltage than necessary.

Figure 2:
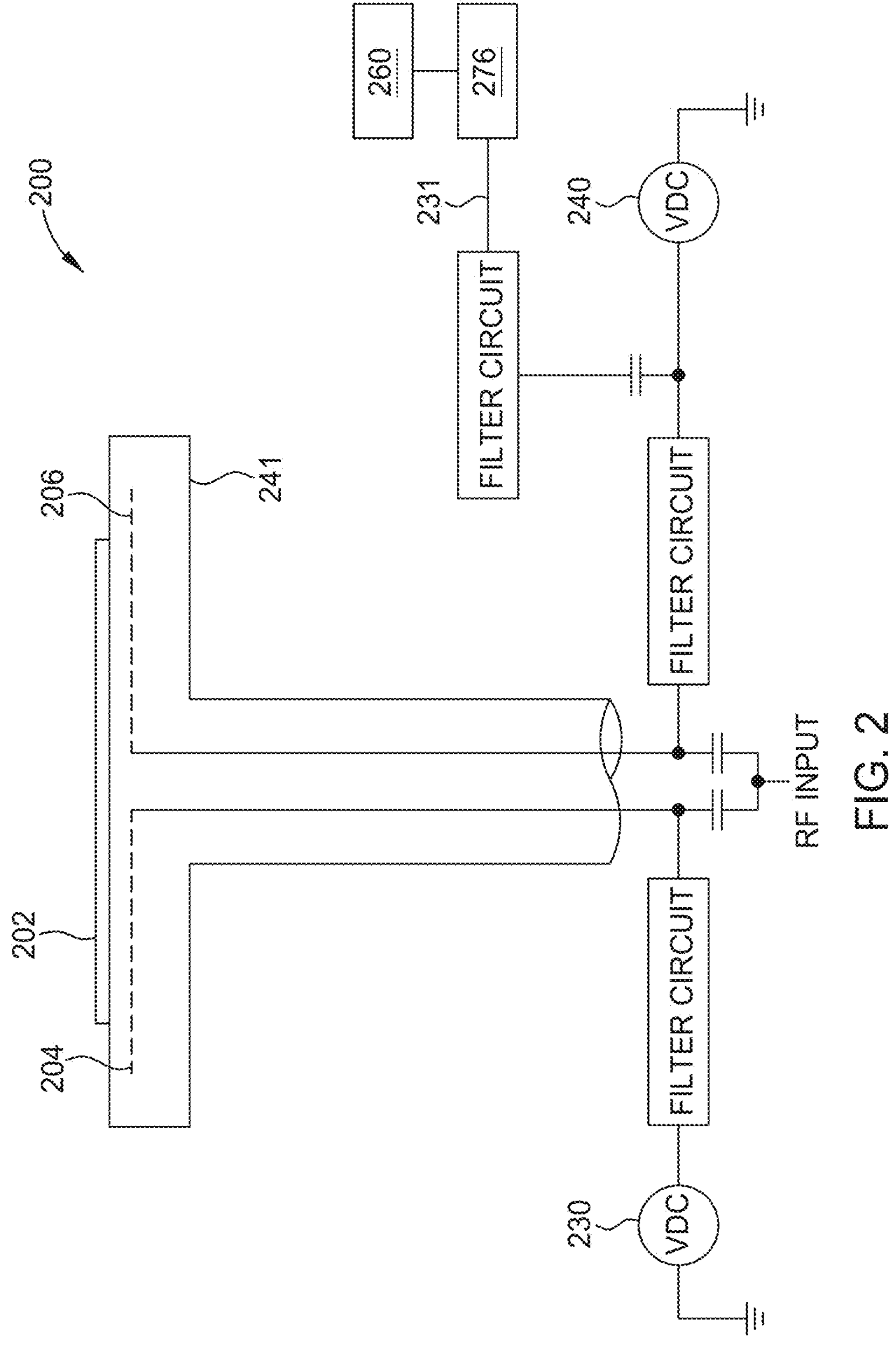
FIG. 2 illustrates a portion of a processing chamber with a bipolar electrostatic chuck (ESC) in a bottom drive configuration, according to one or more embodiments.

FIG. 2 illustrates a portion of a processing chamber 200 configured to perform in situ determination of a substrate chucking state during a substrate process, according to one or more embodiments. The processing chamber 200 may include a pedestal 241 that is configured to support a substrate 202 during a semiconductor process. The embodiment of FIG. 2 includes a bottom-feed system where RF input is provided to the pedestal 241. The same or similar configuration may be used with a top-feed system where the RF input depicted in FIG. 2 is replaced with an RF ground.

The processing chamber 200 may include an ESC for applying a chucking voltage to the substrate 202. In this example, the ESC may be implemented as a bipolar ESC, where different voltages are applied to different electrodes 204, 206 embedded in the pedestal 241. These electrodes 204, 206 may be implemented with any type of conductive material, such as a wire mesh. These electrodes 204, 206 may be embedded at a distance within the pedestal 241. In a bipolar ESC, when opposing chucking voltages are applied to these electrodes 204, 206, an electrostatic force is generated that attracts the substrate 202 to the surface of the pedestal 241.

The ESC may include one or more voltage sources. The sources may also be referred to as ESC sources or DC voltage sources. For example, the processing chamber 200 may include a first DC voltage source 230 and a second DC voltage source 240. The DC voltage sources may be configured to apply approximately equal and opposite DC voltages to the ESC electrodes in the pedestal 241. For example, the first DC voltage source 230 may apply a negative voltage to the first electrode 204, and the second DC voltage source 240 may apply a positive voltage to the second electrode 206. The negative voltage and the positive voltage may be approximately equal. The controller may be configured to dynamically control the magnitude of the positive and negative DC voltages applied by the DC voltage sources. As described below, the controller may adjust the DC voltage sources up/down to initially determine an optimal chucking voltage and to characterize or identify different chucking states of the substrate 202.

The processing chamber 200 further includes one or more power sources 276. The power source 276 may be configured to generate a relatively low-power signal having a frequency range. For example, the signal may include a sweep of frequencies within the frequency range. Therefore, the power source 276 may include a programmable power source, a function generator, and/or other similar device configured to generate a signal having a variable frequency over time. The power source 276 may be controlled by a controller 260, which may be implemented as the controller 101 from FIG. 1.

The signal from the power source 276 may be coupled to one of the DC voltage inputs for the ESC. In this non-limiting example, the signal may share an input to the pedestal 241 with the second DC voltage source 240, thus applying the signal having the frequency range to the second electrode 206.

In some embodiments, such as the embodiment illustrated in FIG. 2, a node 231 exists between the power source 276 and the input to the pedestal 241. In such embodiments, the input impedance to the pedestal 241 may be measured at the node 231. In some embodiments, the power source 276 may include integrated circuitry that measures reflected power and/or input impedance. For example, instead of attempting to directly measure a capacitance change induced by the presence of the substrate, in such embodiments, the impedance may be measured at the point where the signal having the frequency range is injected.

The processing chamber 200 may further include one or more filter circuits. These circuits may be configured to pass the DC chucking voltage to the pedestal 241, while shielding the DC voltage sources from particular RF frequencies used to drive plasma in the processing region above substrate 202.

Figure 3:
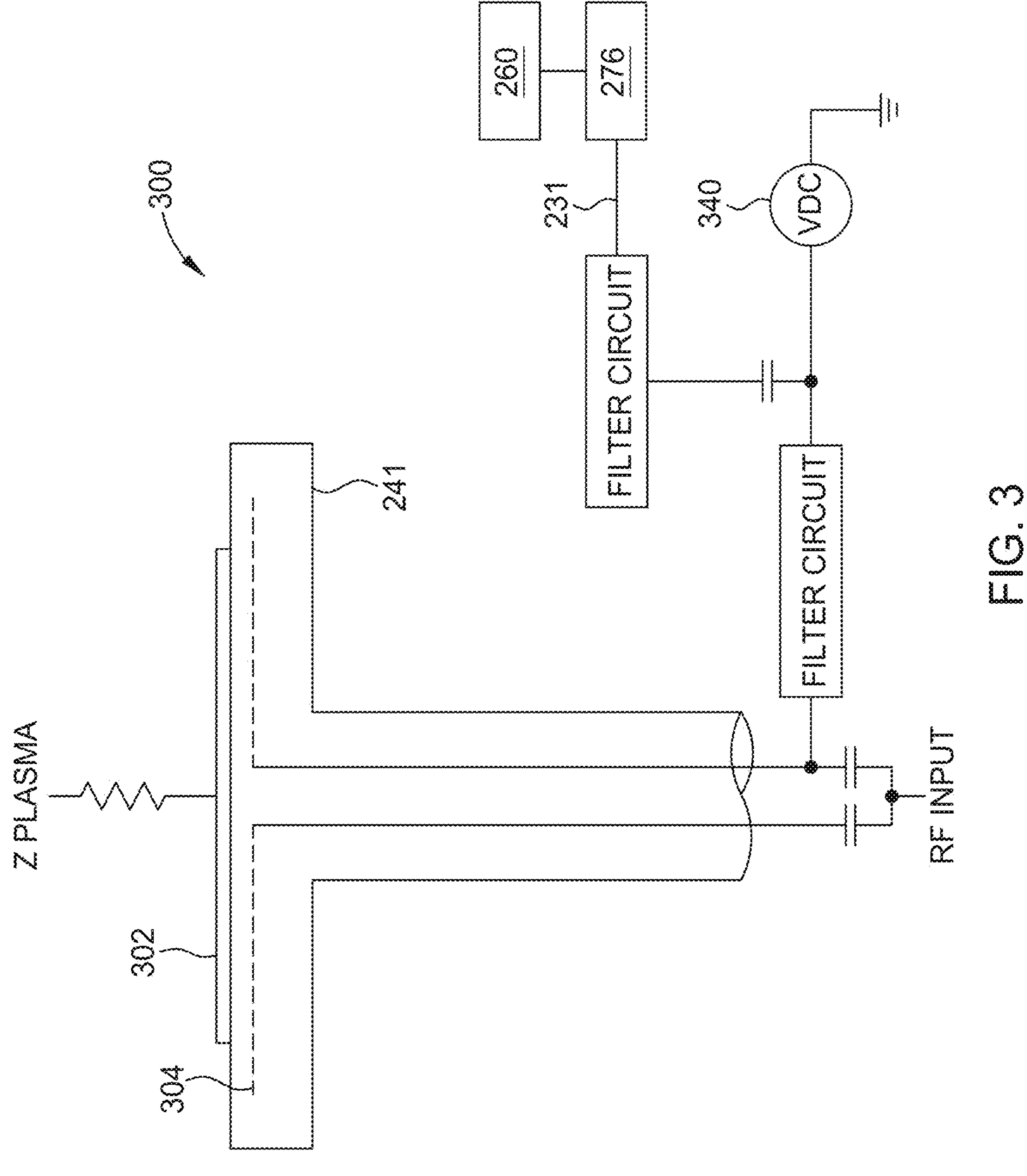
FIG. 3 illustrates a portion of a processing chamber with a monopolar ESC in a bottom drive configuration, according to one or more embodiments

FIG. 3 illustrates a portion of a processing chamber 300 with a monopolar ESC in a bottom drive configuration, according to one or more embodiments. For the sake of brevity, components in FIG. 3 that operate similarly to those in FIG. 2 have been given the same reference number and a description of such components will not be repeated herein.

In a monopolar ESC, the one or more electrodes in the pedestal 241 includes a single electrode 304. A high voltage DC power supply 340 may provide the DC chucking voltage to the single electrode 304. When a plasma is present in the processing region above the substrate 202, a charge may form on the substrate 302 that is the opposite of the charge in the single electrode 304. The attractive forces between the charges may clamp the substrate 302 to the pedestal 241.

Similar to the bipolar ESC of FIG. 2, the power source 276 may inject a signal having a frequency range into the DC chucking input into the single electrode 304. Because the monopolar ESC requires a plasma be present in order for the ESC to operate, it may be useful to only use such monopolar ESC embodiments during certain substrate processes.

Figure 4:
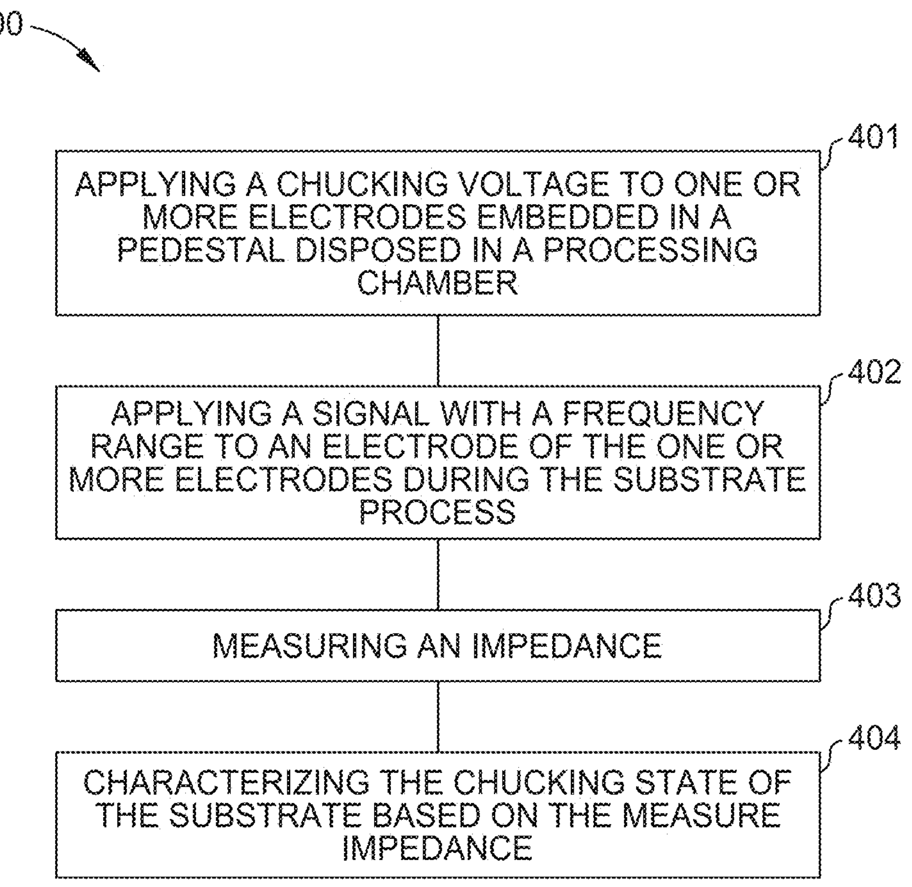
FIG. 4 illustrates a flowchart of a method for monitoring substrate chucking during a semiconductor process, according to one or more embodiments.

FIG. 4 illustrates a method 400 for monitoring substrate chucking status, according to one or more embodiments. This method may be executed by a controller (e.g. controller 101 of FIG. 1). The controller may include one or more processors and one or more non-transitory computer-readable media that store instructions. The instructions may cause the one or more processors to perform the operations described in detail below.

At operation 401, a DC chucking voltage is applied to one or more electrodes (e.g., electrodes 204, 206 and/or electrode 304 of FIG. 3) embedded in a pedestal (e.g., pedestals 104, 241) disposed in a processing chamber (e.g., processing chambers 100, 200, 300). The DC chucking voltage may be an initial chucking voltage applied at the beginning of a substrate process to chuck a substrate (e.g., substrates 103, 202, 302) to the pedestal and may be applied by one of one or more DC voltage sources (e.g., DC voltage sources 230, 240, 340).

At operation 402, a signal is applied to an electrode included in the one or more electrodes during the substrate process. The signal may be injected at a certain frequency or range of frequencies. In some embodiments, the signal is applied from a power source (e.g. power source 276). The signal from the power source may be coupled to one of the one or more DC voltage inputs for the ESC. In some embodiments, the signal may share an input to the pedestal with one of the one or more DC voltage source, thus applying the signal having the frequency range to one of the one or more electrodes.

The power source may be controlled by the controller and may generate a relatively low-power signal having a frequency range. For example, the signal may include a sweep of frequencies within the frequency range.

In order to identify the resulting impedance changes, the signal having the frequency range may be applied as an alternating-current (AC) signal that sweeps the frequency range between a minimum (first) frequency and a maximum (second) frequency (i.e., where the first frequency is less than the second frequency). This frequency range may be relatively low compared to the frequencies of the RF signal used to power a plasma in the processing chamber 200. In some embodiments, the frequency range may be from about 1 kHz to about 1 MHz. For example, the frequency range may be from about 1 kHz to about 100 kHz, from about 100 kHz to about 200 kHz, from about 200 kHz to about 300 kHz, from about 300 kHz to about 400 kHz, from about 400 kHz to about 500 kHz, from about 500 kHz to about 600 kHz, from about 600 kHz to about 700 kHz, from about 700 kHz to about 800 kHz, from about 800 kHz to about 900 kHz, and/or from about 900 kHz to about 1 MHz. The frequency range may also include any combination of frequency ranges described above (e.g., from about 200 kHz to about 800 kHz). Other specific ranges may include from about 50 kHz to about 110 kHz, from about 30 kHz to about 50 kHz, from about 150 kHz to about 250 kHz, and so forth. The signal may also be applied using any individual frequency in the ranges described above (e.g., about 30 kHz, about 50 kHz, about 110 kHz, about 150 kHz, about 250 kHz, about 350 kHz, and so forth).

At operation 403, an impedance is measured when the signal having the frequency range is applied to the electrode. The impedance may be measured as an input impedance to the pedestal observed from the power source, such as at a node (e.g., node 231) between the power source and the pedestal. In some embodiments wherein the power source includes previously described integrated circuitry, reflected power and/or input impedance may be measured at said integrated circuitry. For example, instead of attempting to directly measure a capacitance change induced by the presence of the substrate, in such embodiments, the impedance may be measured at the point where the signal having the frequency range is injected.

At operation 404, the chucking state of the substrate is characterized based on the impedance measured at operation 403. For example, the substrate may be characterized as "not-chucked," "under-chucked," "fully-chucked," or "over-chucked." The impedance measured at operation 403 is indicative of the chucking state because when the substrate is fully-chucked, the substrate is flat against the pedestal resulting in capacitive coupling between the one or more electrodes and the other one or more electrodes and/or the electrode and the substrate. Similarly, when the substrate is not fully-chucked (e.g., not-chucked, under-chucked), less of the substrate may be contacting the pedestal leading to less capacitive coupling.

In one or more embodiments, the impedance measured at operation 403 may be converted into a chucking status value or a figure of merit (FOM), where the FOM indicates whether the substrate is not-chucked, under-chucked, fully-chucked, or over-chucked.

In one or more embodiments, the measured impedance is converted into the FOM by comparing the measured impedance to one or more baseline values. For instance, the measured impedance value can be compared to a first baseline value that is an empirically obtained impedance value indicative of there being no substrate in the chamber or on the pedestal. Such an impedance value would be representative of a substrate being not-chucked because a not-chucked substrate would have similar impedance measurements to a chamber without a substrate.

Similarly, the measured impedance can be compared to a second baseline value. The second baseline value may be an empirically obtained impedance value indicative of a flat (or substantially flat) substrate in the chamber and disposed on the pedestal. Such an impedance value would be representative of a substrate being fully-chucked because a fully-chucked substrate would have similar impedance measurements to a chamber with a flat substrate.

Based on one or more of these comparisons, the chucking status of the substrate can be obtained. For instance, if the no-substrate impedance is measured, the substrate is not-chucked, if the flat-substrate impedance is measured, the substrate may be fully-chucked, and if the impedance falls somewhere between, the substrate may be under-chucked. Accordingly, the FOM may fall within a range of values indicating whether a substrate is not-chucked, under-chucked, and fully-chucked. If the chucking voltage is further increased after the substrate is fully-chucked, the substrate may be over-chucked.

In one or more embodiments, the measured impedance is normalized over the swept frequency range to obtain the FOM. In embodiments, wherein the measured impedance is normalized over the swept frequency range, the FOM may be a value between 0 and 1 where an FOM of 0 is indicative of a substrate not present, an FOM of between 0 and nearly 1 is indicative of the substrate being under-chucked or partially-chucked, and an FOM of close to 1 is indicative of a fully-chucked substrate.

Figure 5:
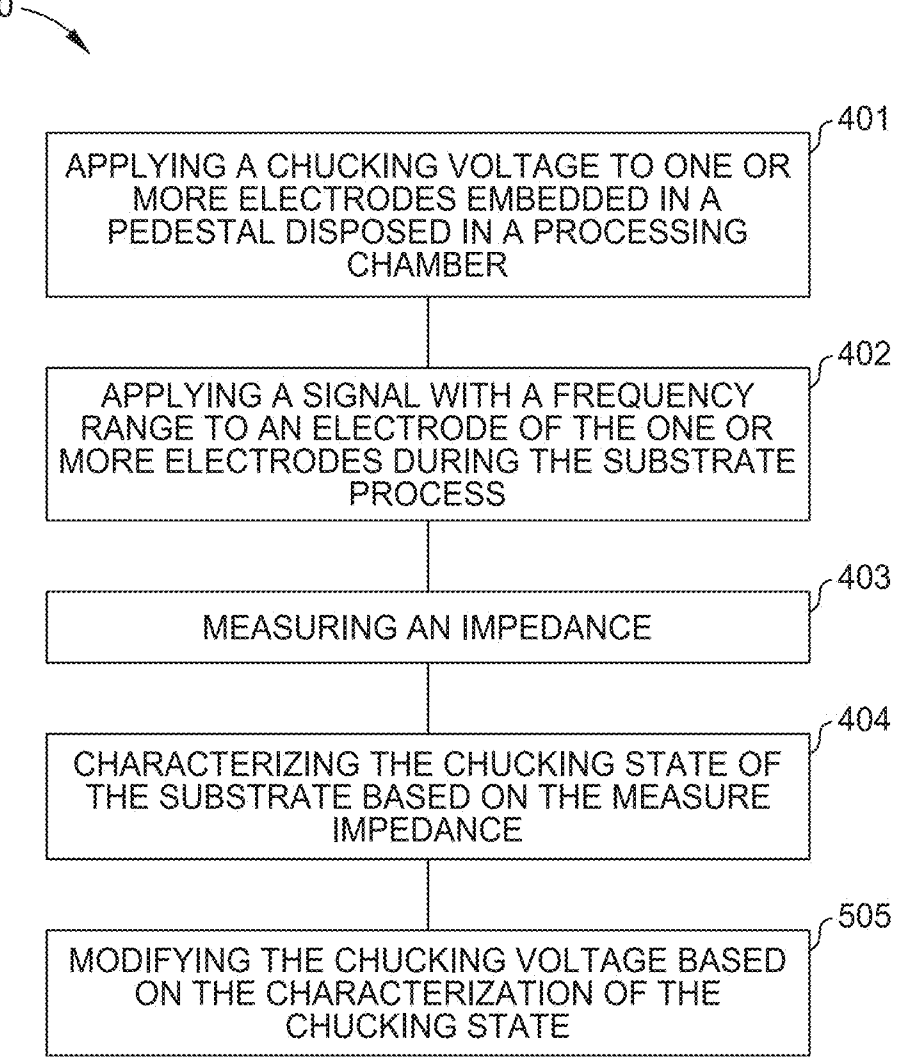
FIG. 5 illustrates a method for actively controlling ESC voltage during a semiconductor process, according to one or more embodiments.

FIG. 5 illustrates a method 500 for actively controlling the chucking status of a substrate (e.g. substrates 103, 202, 302). Method 500 begins with operations 401-404. For the sake of brevity, descriptions of operations 401-404 will not be duplicated herein. At operation 505, the chucking voltage applied at operation 401 is modified based on the characterization in operation 404 to maintain a fully-chucked substrate. For instance, if the FOM indicates the substrate is not fully-chucked, the chucking voltage may be increased. For instance, if the FOM indicates the substrate is over-chucked, the chucking voltage may be decreased. Similarly, if the FOM indicates the substrate is fully-chucked, or within a threshold of chucking, the chucking voltage may be held constant.

Figure 6:
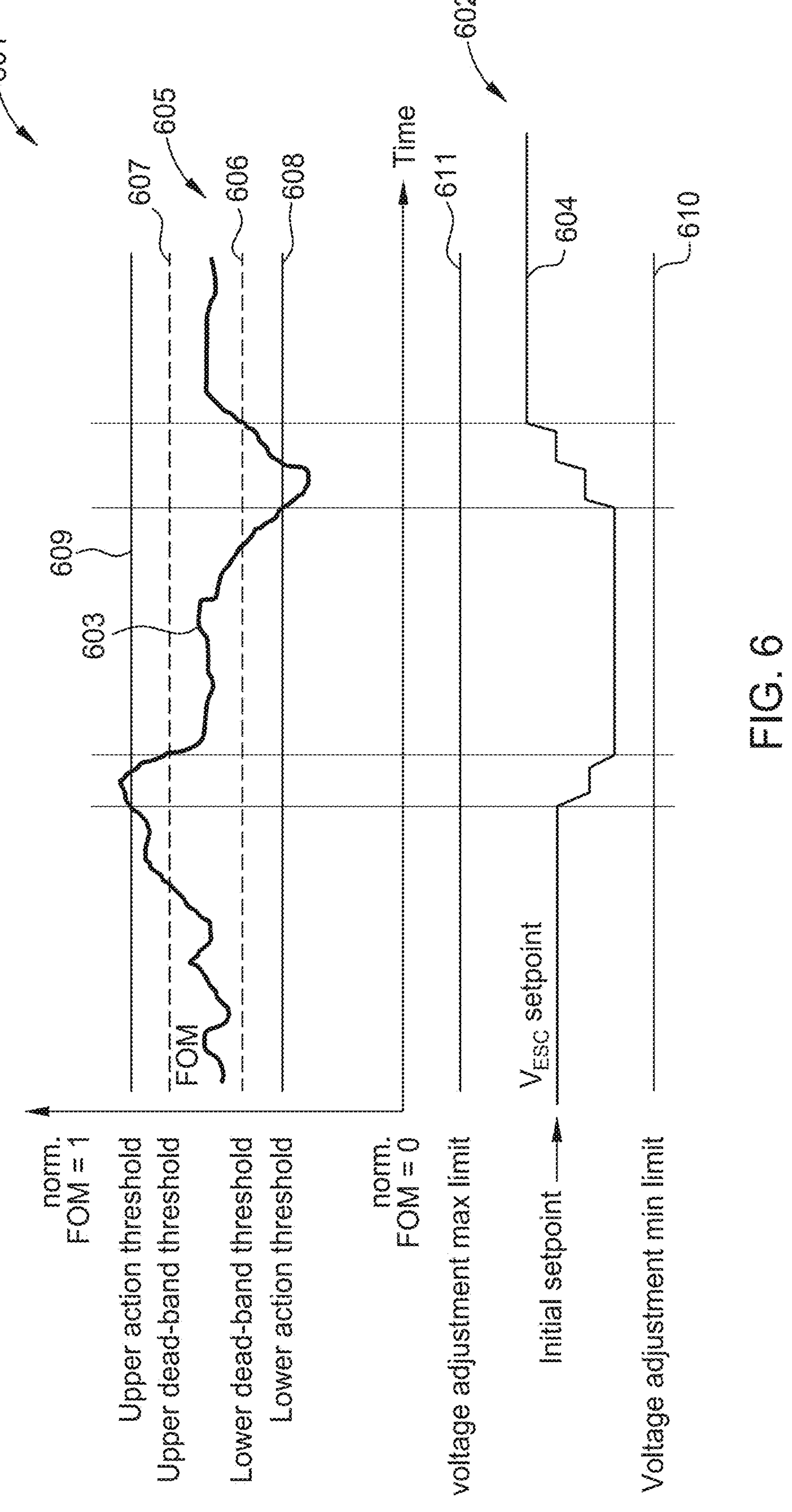
FIG. 6 is a chart illustrating the method for actively controlling ESC voltage during a semiconductor process of FIG. 5, according to one or more embodiments.

FIG. 6 illustrates a chart visually representing an exemplary operation 505. Chart 601 illustrates real-time FOM measurements 603 and chart 602 represents the corresponding chucking voltage 604. Chart 601 includes a deadband threshold 605 having a lower deadband threshold limit 606 and an upper deadband threshold limit 607. When the real-time FOM 603 falls within the deadband threshold 605, the substrate is fully-chucked or within an acceptable range of under-chucking or over-chucking such that no active control of the chucking status of the substrate is necessary.

In the embodiment illustrated in FIG. 6, when the real-time FOM 603 is above the deadband threshold 605, the real-time FOM 603 indicates that the substrate is over-chucked. When the real-time FOM 603 is below the deadband threshold 605, the real-time FOM 603 indicates that the substrate is under-chucked. Accordingly, in the embodiment in FIG. 6, the real-time FOM 603 indicates whether the substrate is fully-chucked, over-chucked, or under-chucked. Chart 601 also includes a lower action threshold 608 and an upper action threshold 609 for triggering remedial action.

When the real-time FOM 603 is within the deadband threshold 605, the real-time FOM 603 is indicative of the substrate being fully-chucked or in an acceptable range of under-chucking and/or over chucking such that no voltage modification is necessary. For instance, the FOM 603 being within the deadband threshold 605 may indicate the substrate is chucked 60% or more, 70% or more, or 80% or more, 140% or less, 130% or less, 120% or less. When the FOM 603 exceeds the upper action threshold 609, the substrate is over-chucked and outside of an acceptable range of over-chucking, such that remedial action is needed to bring the chucking status within the acceptable range. When the FOM 603 falls below the lower action threshold 608, the substrate is under-chucked and outside of an acceptable range of under-chucking, such that remedial action is needed to bring the chucking status within the acceptable range.

Accordingly, when the real-time FOM 603 falls within the deadband threshold 605, the chucking voltage 604 is held constant because the real-time FOM 603 is indicating the substrate is fully-chucked or within an acceptable chucking range. If the real-time FOM 603 falls below the lower action threshold 608, thus indicating that the substrate is under-chucked outside of an acceptable range and remedial action is needed, the chucking voltage 604 is increased until the real-time FOM 603 falls into the deadband threshold 605. Similarly, if the real-time FOM 603 exceeds the upper action threshold 609, thus indicating that the substrate is over-chucked outside of an acceptable chucking range and remedial action is needed, the chucking voltage 604 is decreased until the real-time FOM 603 falls into the deadband threshold 605. In one or more embodiments, chart 602 also includes a lower voltage adjustment limit 610 and an upper voltage adjustment limit 611 thus preventing the chucking voltage from being decreased or increased outside of the chucking voltage limits.

Therefore, method 500 allows for active chucking control by monitoring the real-time FOM 603 obtained from an impedance measurement.

Figure 7:
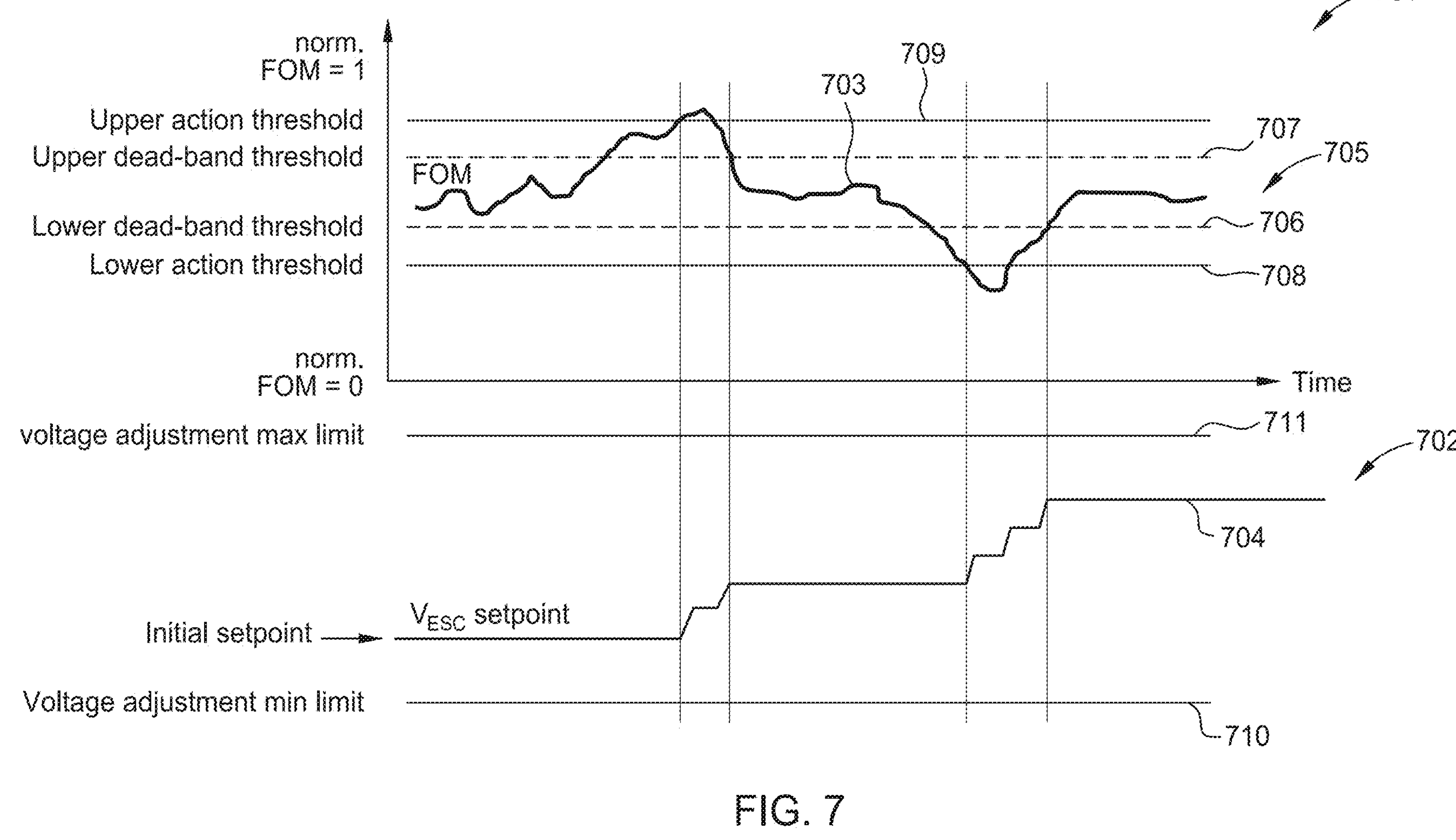
FIG. 7 is another chart illustrating the method for actively controlling ESC voltage during a semiconductor process of FIG. 5, according to one or more embodiments.

FIG. 7 illustrates another chart visually representing another exemplary operation 505. Chart 701 illustrates real-time FOM measurements 703 and chart 702 represents the corresponding chucking voltage 704. Chart 701 includes a deadband threshold 705 having a lower deadband threshold limit 706 and an upper deadband threshold limit 707. When the real-time FOM 703 falls within the deadband threshold 705, the substrate is fully-chucked or within an acceptable range of under-chucking such that no active control of the chucking status of the substrate is necessary. In the embodiment illustrated in FIG. 7, when the real-time FOM 703 is above the deadband threshold 705, the real-time FOM 703 indicates that the substrate is under-chucked. When the real-time FOM 703 is below the deadband threshold 705, the real-time FOM 703 also indicates that the substrate is under-chucked. Accordingly, in the embodiment in FIG. 7, the real-time FOM 703 indicates whether the substrate is fully-chucked or under-chucked. Chart 701 also includes a lower action threshold 708 and an upper action threshold 709 for triggering remedial action.

When the real-time FOM 703 is within the deadband threshold 705, the real-time FOM 703 is indicative of the substrate being fully-chucked or in an acceptable range of under-chucking such that no voltage modification is necessary. For instance, the FOM 703 being within the deadband threshold 705 may indicate the substrate is chucked 60% or more, 70% or more, or 80% or more. When the FOM 703 exceeds the upper action threshold 709, the substrate is under-chucked and outside of an acceptable range of under-chucking, such that remedial action is needed to bring the chucking status within the acceptable range. When the FOM 703 falls below the lower action threshold 708, the substrate is also under-chucked and outside of an acceptable range of under-chucking, such that remedial action is needed to bring the chucking status within the acceptable range.

Accordingly, when the real-time FOM 703 falls within the deadband threshold 705, the chucking voltage 704 is held constant because the real-time FOM 703 is indicating the substrate is fully-chucked or within an acceptable chucking range. If the real-time FOM 703 falls below the lower action threshold 708, thus indicating that the substrate is under-chucked and outside of an acceptable range and remedial action is needed, the chucking voltage 704 is increased until the real-time FOM 703 falls into the deadband threshold 705. Similarly, if the real-time FOM 703 exceeds the upper action threshold 709, thus indicating that the substrate is also under-chucked and outside of an acceptable chucking range and remedial action is needed, the chucking voltage 704 is also increased until the real-time FOM 703 falls into the deadband threshold 705. In one or more embodiments, chart 702 also includes a lower voltage adjustment limit 710 and an upper voltage adjustment limit 711 thus preventing the chucking voltage from being decreased or increased outside of the chucking voltage limits.

In one or more embodiments, the determinations made in method 500 as to the chucking status may be facilitated by one or more sensors in the chamber including, but not limited to, sensors configured to measure electrostatic chuck current or RF reflected power. In one or more embodiments, the one or more sensors are redundant determinations used to confirm or check the chucking status determination using the FOM. In one or more embodiments, the one or more sensors may facilitate in determining whether the substrate is under-chucked.

Methods 400 and 500 allow for monitoring of chucking status and active chucking control during substrate processes. For instance, in some embodiments, methods 400 and 500 may be conducted during substrate processes where RF plasma is not being generated because RF power is off or gases are not being flowed. In some embodiments, methods 400 and 500 may be conducted when RF plasma is being generated, that is, when RF power is on and when gasses are being flowed into the processing chamber. In some embodiments, methods 400 and 500 may be conducted during substrate processes where the processing chamber is pressurized and one or more gases are flowing into the processing chamber. In some embodiments, methods 400 and 500 may be conducted when the chamber is pressurized. For instance, the chamber may be pressurized at less than 760 torr, less than 200 torr, less than 100 torr, less than 10 torr, or 5 mtorr to 20 torr. In some embodiments, methods 400 and 500 may be conducted when the chamber is pressurized at 9 torr.

Certain details are set forth in the following description and figures to provide a thorough understanding of various embodiments of the disclosure. Other details describing well-known structures and systems often associated with plasma processing are not set forth in the following disclosure to avoid unnecessarily obscuring the description of the various embodiments.

What is claimed is:

1. A method for monitoring a chucking status of a substrate, comprising:

supplying a chucking voltage to an electrostatic chuck disposed in a substrate pedestal, wherein a substrate is supported by the substrate pedestal;

applying a signal having a frequency range to an electrode of the electrostatic chuck;

measuring an impedance of the signal;

determining a chucking status value, wherein determining the chucking status value comprises comparing the measured impedance with a baseline impedance value, and wherein the baseline impedance value is indicative of the substrate pedestal not supporting the substrate; and determining a chucking status of the substrate based on the chucking status value.

2. The method of claim 1, further comprising comparing the measured impedance to a second baseline impedance value, wherein the second baseline impedance value is indicative of the substrate pedestal supporting a flat substrate.

3. The method of claim 1, wherein the chucking status comprises not-chucked, under-chucked, fully-chucked, or over-chucked.

4. A method for monitoring a chucking status of a substrate, comprising:

supplying a chucking voltage to an electrostatic chuck disposed in a substrate pedestal, wherein a substrate is supported by the substrate pedestal;

applying a signal having a frequency range to an electrode of the electrostatic chuck;

measuring an impedance of the signal;

normalizing the impedance over the frequency range;

determining a chucking status value, wherein determining the chucking status value comprises comparing the normalized impedance to a baseline impedance value, and wherein the baseline impedance value is indicative of the substrate pedestal not supporting the substrate; and determining a chucking status of the substrate based on the chucking status value.

5. The method of claim 4, further comprising comparing the measured impedance to a second baseline impedance value, wherein the second baseline impedance value is indicative of the substrate pedestal supporting a flat substrate.

6. The method of claim 4, wherein the chucking status value is between 0 and 1.

7. A method for actively controlling chucking voltage to chuck a substrate, comprising:

supplying a chucking voltage to an electrostatic chuck disposed in a substrate pedestal, wherein a substrate is supported by the substrate pedestal;

applying a signal having a frequency range to an electrode of the electrostatic chuck;

measuring an impedance of the signal;

determining a chucking status value, wherein determining the chucking status value comprises comparing the measured impedance to a baseline impedance value, and wherein the baseline impedance value is indicative of the substrate pedestal not supporting the substrate;

determining a chucking status of the substrate based on the chucking status value; and modifying the chucking voltage based on the chucking status value.

8. The method of claim 7, wherein the chucking status comprises not-chucked, under-chucked, fully-chucked, or over-chucked.

9. The method of claim 7, wherein the measured impedance is normalized across the frequency range.

10. The method of claim 7, wherein modifying the chucking voltage based on the chucking status value comprises decreasing the chucking voltage when the chucking status value is above a first range of chucking status values.

11. The method of claim 10, wherein modifying the chucking voltage based on the chucking status value further comprises decreasing the chucking voltage until the chucking status value enters a second range of chucking status values, wherein the second range falls within the first range.

12. The method of claim 7, wherein modifying the chucking voltage based on the chucking status value comprises increasing the chucking voltage when the chucking status value is below a first range of chucking status values.

13. The method of claim 12, wherein modifying the chucking voltage based on the chucking status value further comprises increasing the chucking voltage until the chucking status value enters a second range of chucking status values, wherein the second range falls within the first range.

* * * * *